United States Patent
Perner

Patent Number: 5,969,399
Date of Patent: Oct. 19, 1999

[54] HIGH GAIN CURRENT MODE PHOTO-SENSOR

[75] Inventor: Frederick A. Perner, Palo Alto, Calif.

[73] Assignee: Hewlett-Packard Company, Palo Alto, Calif.

[21] Appl. No.: 09/080,996

[22] Filed: May 19, 1998

[51] Int. Cl.$^6$ .................................................. H01L 31/00
[52] U.S. Cl. ..................... 257/443; 257/448; 257/461; 257/462; 257/465; 257/567; 257/568; 257/573
[58] Field of Search .................................. 257/462, 465, 257/461, 443, 448, 567, 568, 573

[56] References Cited

U.S. PATENT DOCUMENTS

| | | | |
|---|---|---|---|
| 2,948,815 | 8/1960 | Willems et al. | 250/211 |
| 3,748,546 | 7/1973 | Allison | 317/235 R |
| 4,107,721 | 8/1978 | Miller | 357/30 |
| 5,126,814 | 6/1992 | Nakamura et al. | 357/30 |
| 5,252,851 | 10/1993 | Mita et al. | 257/446 |
| 5,382,824 | 1/1995 | Popovic | 257/464 |
| 5,767,538 | 6/1998 | Mullins et al. | 257/115 |

Primary Examiner—William Mintel

[57] ABSTRACT

A high gain photodetector requiring a substantially silicon area than prior art photodetectors having the same gain. The photodetector includes a light converter for converting a light signal to a current; and a first vertical transistor. The first vertical transistor includes a first well in a semiconductor substrate, the first well including a diffusion region, the semiconductor substrate and the diffusion having a first type of doping and the first well having a second type of doping. The first type of doping is either P-type or N-type, and the second type of doping is the other of the P-type or N-type doping. The light converter is connected to the first well so as to forward bias the vertical transistor thereby causing a current to flow between the diffusion region in the first well and the substrate. Additional amplification of the photocurrent from the light converter can be provided by including a second vertical transistor. The second vertical transistor includes a second well in the semiconductor substrate, the second well including a second diffusion region. The semiconductor substrate and the second diffusion having the first type of doping and the second well having the second type of doping. The first vertical transistor and the second vertical transistor are connected as a Darlington pair. The amplified current from the vertical transistor(s) is converted to a voltage by a current to voltage converter.

4 Claims, 2 Drawing Sheets

HIGH GAIN CURRENT MODE PHOTO-SENSOR

FIELD OF THE INVENTION

The present invention relates to photodetectors, and more particularly, to a high gain photodetector for generating a binary value based on light intensity.

BACKGROUND OF THE INVENTION

There are a number of situations in which a moveable carriage must be aligned over a stationary object by detecting a fiducial mark on the stationary object. One method for detecting the fiducial mark "on the fly" is to incorporate an array of photodetectors on the moveable carriage. If the array is sufficiently large, the fiducial mark will alter the light at one or more of the detectors. By determining the identity of the photodetectors that "fired", the location and size of the fiducial mark can be deduced.

If the light signal is weak, a high gain photodetector must be utilized. Such a detector requires a two stage operational amplifier followed by a current to voltage translator. The area on the chip required for the operational amplifiers limits the density of photodetectors in the array. Hence, it would be advantageous to provide a high gain photodetector that requires less area to construct.

Broadly, it is the object of the present invention to provide an improved photodetector.

It is a further object of the present invention to provide a photodetector that requires less area than prior art photodetectors having the same gain.

These and other objects of the present invention will become apparent to those skilled in the art from the following detailed description of the invention and the accompanying drawings.

SUMMARY OF THE INVENTION

The present invention is a high gain photodetector that can be constructed in a substantially smaller space than prior art photodetectors having the same gain. The photodetector includes a light converter for converting a light signal to a current; and a first vertical transistor. The first vertical transistor includes a first well in a semiconductor substrate, the first well including a diffusion region, the semiconductor substrate and the diffusion having a first type of doping and the first well having a second type of doping. The first type of doping is either P-type or N-type, and the second type of doping is the other of the P-type or N-type doping. The light converter is connected to the first well so as to forward bias the vertical transistor thereby causing a current to flow between the diffusion region in the first well and the substrate. In the preferred embodiment of the present invention, the light converter is a photodiode constructed from a diffusion region of the second type doping in the semiconductor substrate. Additional amplification of the photocurrent from the light converter can be provided by including a second vertical transistor. The second vertical transistor includes a second well in the semiconductor substrate, the second well including a second diffusion region. The semiconductor substrate and the second diffusion having the first type of doping and the second well having the second type of doping. The first vertical transistor and the second vertical transistor are connected as a Darlington pair. The amplified current from the vertical transistor(s) is converted to a voltage by a current to voltage converter connected to the first diffusion region for converting current flowing through the diffusion region into a voltage.

DETAILED DESCRIPTION OF THE INVENTION

Figure 1:
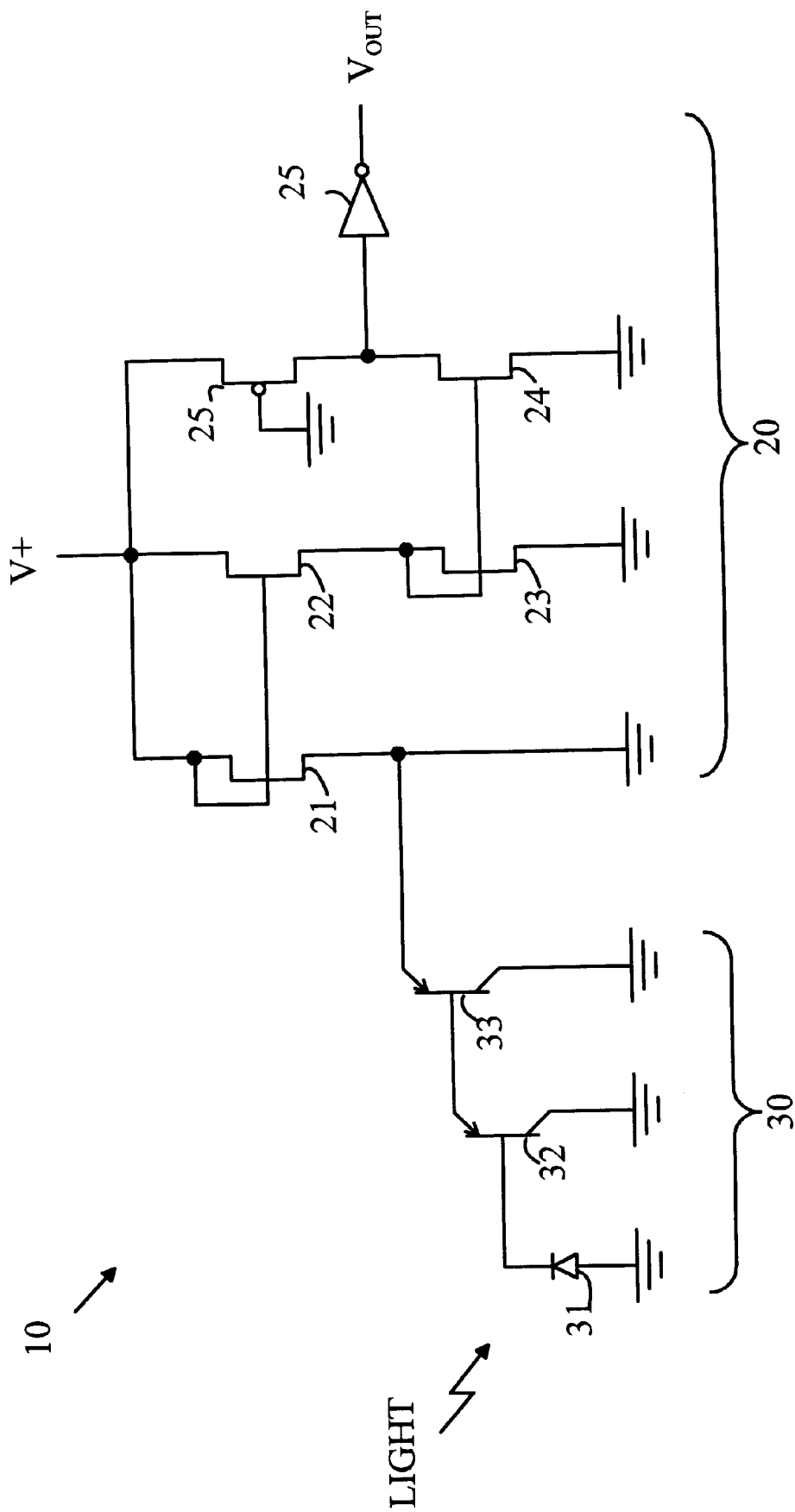
FIG. 1 is a schematic drawing of a photodetector according to the present invention.
Figure 2:
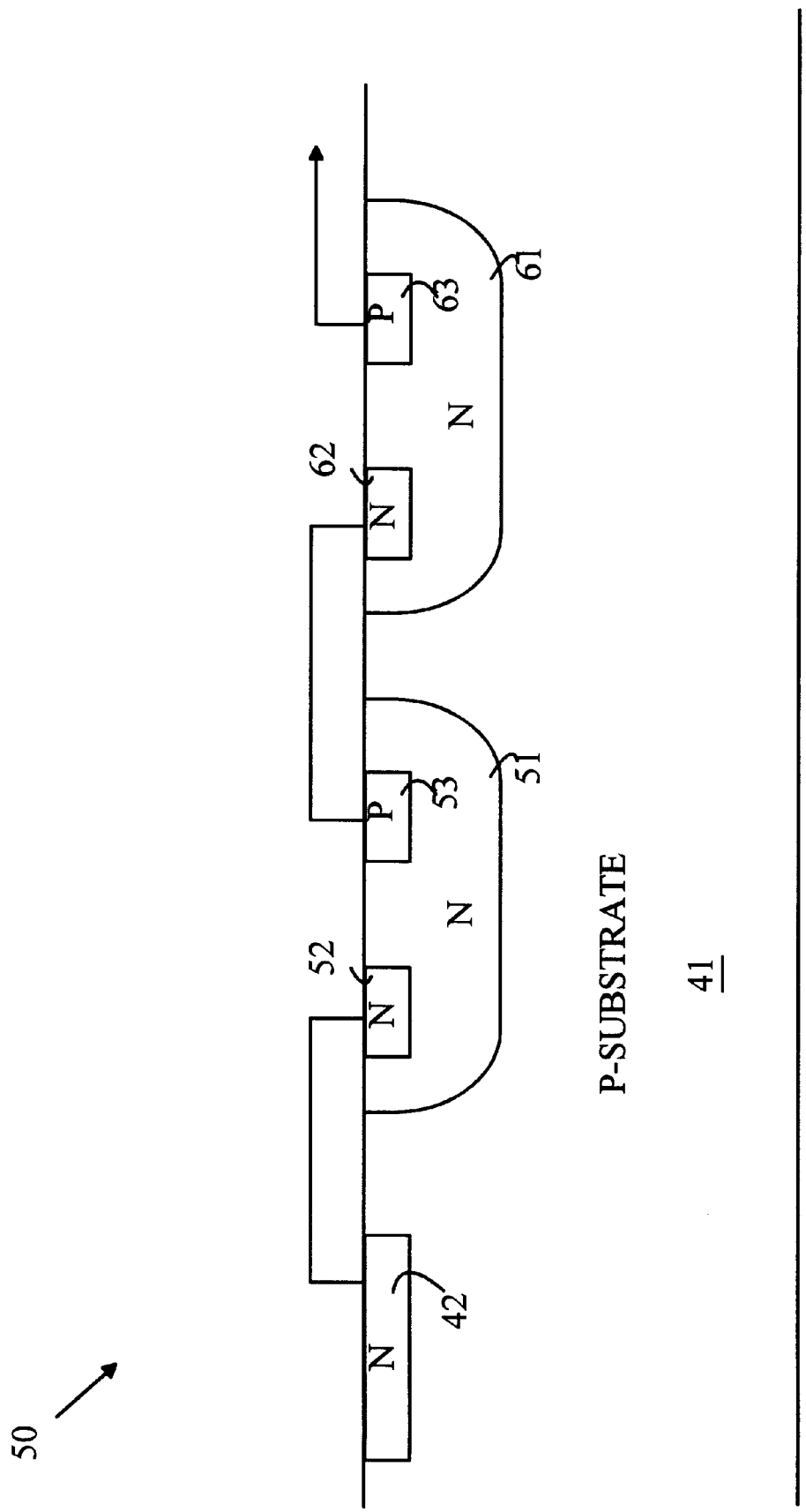
FIG. 2 is a cross-sectional view of a portion of an integrated circuit chip having a photodetector according to the present invention constructed thereon.

The manner in which the present invention achieves its advantages may be more easily understood with reference to FIGS. 1 and 2. FIG. 1 is a schematic drawing of a photodetector according to the present invention, and FIG. 2 is a cross-sectional view through a portion of an integrated circuit chip illustrating the construction of the PNP transistors utilized in the present invention. Referring to FIG. 1, photosensor 10 is constructed from a conventional photo-diode 31 and two vertical PNP bipolar transistors shown at 32 and 33. A current mode detector 30 supplies a current in response to a light signal to the photo-diode 31.

Current amplification is provided by the two vertical PNP transistors 32, 33 which require significantly less silicon area than operational amplifiers used to provide the equivalent function in a conventional photodetector. The PNP vertical bipolar transistors 32, 33 are made from layers available in a conventional N-well/CMOS process with the emitter formed with the P+S/D diffusion layer shown at 53 and 63 in FIG. 2. The bases of the transistors 32, 33 are formed by the N-Well layer shown at 51 and 61 with a N+Well contact shown at 52 and 62. A common collector is formed by the P+/P− Substrate 41. A combined current gain of over 1000 is expected from the two transistors 32, 33 which are connected in a Darlington configuration as shown in FIG. 1. The two transistors 32, 33 in the current mode detector 30 amplify the photo-current generated in photo-diode 31 to a level at which the current can be sensed directly by the current to voltage translator and buffer amplifier circuit shown at 20. This current mode detector 30 responds quickly to the transition between light and dark without requiring a significant integration time as is the case with conventional voltage mode photo sensors.

The current to voltage translator 20 is constructed from a small current sensor transistor 21 and a large current mirror transistor 22. By adjusting the ratio of the sizes of transistors 21 and 22 additional current gain (~10X) can be obtained. Transistors 23 and 24 form another current mirror to buffer the large swing digital output driver 25 from the sensor current mirror.

The above-described embodiment of the present invention utilizes two vertical PNP transistors to provide a large gain in a small amount of silicon space. It will be obvious to those skilled in the art from the preceding discussion that additional vertical transistors could be similarly connected to provide additional gain if needed. Similarly, if the light signal is sufficiently intense, a single vertical PNP transistor could be utilized.

The above-described embodiments of the present invention have utilized PNP transistors constructed on a P-type substrate. It will be obvious to those skilled in the art from the preceding discussion that the present invention can also be implemented with vertical NPN transistors constructed on an N-type substrate.

Various modifications to the present invention will become apparent to those skilled in the art from the foregoing description and accompanying drawings.

Accordingly, the present invention is to be limited solely by the scope of the following claims.

What is claimed is:

1. A photodetector comprising:
    a light converter for converting a light signal to a current; and
    a first vertical transistor, said first vertical transistor comprising a first well in a semiconductor substrate, said first well including a first diffusion region, said semiconductor substrate and said first diffusion region having a first type of doping and said first well having a second type of doping, wherein said first type of doping is either P-type or N-type and said second type of doping is the other of said P-type or N-type, said light converter being connected to said first well so as to forward bias said first vertical transistor.

2. The photodetector of claim 1 wherein said light converter comprises a photodiode comprising a diffusion region of said second type doping in said semiconductor substrate.

3. The photodetector of claim 1 further comprising a second vertical transistor, said second vertical transistor comprising a second well in said semiconductor substrate, said second well including a second diffusion region, said semiconductor substrate and said second diffusion having said first type of doping and said second well having said second type of doping, said first vertical transistor and said second vertical transistor are connected as a Darlington pair.

4. The photodetector of claim 3 further comprising a current to voltage converter connected to said second diffusion region for converting current flowing through said second diffusion region into a voltage.

* * * * *